(12) United States Patent
Matsumoto et al.

(10) Patent No.: US 6,337,489 B1
(45) Date of Patent: Jan. 8, 2002

(54) BONDING APPARATUS

(75) Inventors: Yasuhisa Matsumoto; Shoichi Sakai; Hiroyuki Takagi, all of Ishikawa (JP)

(73) Assignee: Shibuya Kogyo Co., Ltd., Ishikawa (JP)

(*) Notice: Subject to any disclaimer, the term of this patent is extended or adjusted under 35 U.S.C. 154(b) by 0 days.

(21) Appl. No.: 09/420,588

(22) Filed: Oct. 19, 1999

(30) Foreign Application Priority Data

Oct. 26, 1998 (JP) .......................................... 10-321279

(51) Int. Cl.⁷ .............................................. H01L 21/60
(52) U.S. Cl. ............................ 250/559.08; 250/559.33; 29/740; 228/105; 228/8
(58) Field of Search ....................... 250/559.29, 559.33, 250/559.34, 559.07, 559.08; 348/87, 94, 95; 29/832, 833, 834, 407.04, 712, 720, 740; 156/64; 228/103, 105, 4.5, 8, 9, 10

(56) References Cited

U.S. PATENT DOCUMENTS

| | | | | |
|---|---|---|---|---|
| 4,817,849 A | * | 4/1989 | Yamamoto et al. | ......... 228/103 |
| 5,864,944 A | * | 2/1999 | Kashiwagi et al. | ........... 29/833 |
| 5,985,064 A | * | 11/1999 | Sato | ............................. 156/64 |
| 6,070,778 A | * | 6/2000 | Takahashi et al. | ........... 228/4.5 |
| 6,205,636 B1 | * | 3/2001 | Abe et al. | .................. 29/407.1 |

FOREIGN PATENT DOCUMENTS

JP 9-64106 7/1997 ........... H01L/21/60

* cited by examiner

*Primary Examiner*—John R. Lee
(74) *Attorney, Agent, or Firm*—Sughrue Mion, PLLC

(57) ABSTRACT

A bonding apparatus has a bonding tool for holding a chip on a mount surface, an elevating mechanism for elevating the bonding tool, and a chip recognition camera for taking a picture of the chip from its lower side. A detecting device is provided for detecting contact between the chip and the bonding tool. A controlling device is provided for displacing the bonding tool from the position where the detection means has detected contact between the chip and the bonding tool by an amount, in the height direction, equal to a difference between the mount surface and a focal position of the chip recognition camera, so as to place the bonding tool above the chip recognition camera.

1 Claim, 3 Drawing Sheets

BONDING APPARATUS

BACKGROUND OF THE INVENTION

1. Field of the Invention

The present invention relates to a focusing function of an image recognition camera for use for positioning a chip and a substrate with high precision in a bonding apparatus. The present invention relates to an improvement of a focusing means of a chip recognition camera particularly in image recognition devices for automatically performing image processing without fuzziness.

The present application is based on Japanese Patent Application No. Hei. 10-321279 which is incorporated herein by reference.

2. Description of the Related Art

In the related art, in order to focus an image recognition device in a bonding apparatus, there were a method in which automatic focusing was performed by means of an optical unit with a built-in laser displacement meter, and a method in which focusing was performed on the basis of the thickness of a substrate and the thickness of a chip which were set in advance.

However, in the method in which automatic focusing was performed by an optical unit with a built-in laser displacement meter, there was a defect that the bonding apparatus became expensive because two optical units were required on the chip side and on the substrate side. On the other hand, in the method in which focusing is performed on the basis of the thickness of a substrate and the thickness of a chip which are set in advance, at the present time where positioning with high precision is required as chips are reduced in size, there arises a problem that the position of the chip recognition camera must be set again manually if the amount of scattering in the length of the bonding tool and the thickness of the chip exceeds the focal depth of a lens.

SUMMARY OF THE INVENTION

It is an object of the present invention to provide a device by which automatic focusing of an image recognition camera for a chip can be achieved at a comparatively low cost in a bonding apparatus, and, hence, to provide a bonding apparatus in which image processing can be performed on the basis of a sharp image without fuzziness, so that a chip can be positioned on a substrate with high precision.

In order to solve the foregoing object, according to the present invention, there is provided a bonding apparatus. The bonding apparatus comprises a bonding tool for holding a chip mounted on a mount surface, an elevating mechanism for elevating the bonding tool, a chip recognition camera for taking a picture of the held chip from a lower side of the chip, a detecting device for detecting a contact between the chip on the mount surface and the bonding tool, and a controlling device for displacing the bonding tool in a direction of height from a position where the detecting device has detected the contact between the chip and the bonding tool by a quantity equal to a difference in the height direction between the mount surface and a focal position of the chip recognition camera to thereby place the bonding tool above the chip recognition camera.

Features and advantages of the invention will be evident from the following detailed description of the preferred embodiments described in conjunction with attached drawings.

DETAILED DESCRIPTION OF THE PREFERRED EMBODIMENTS

Figure 1:
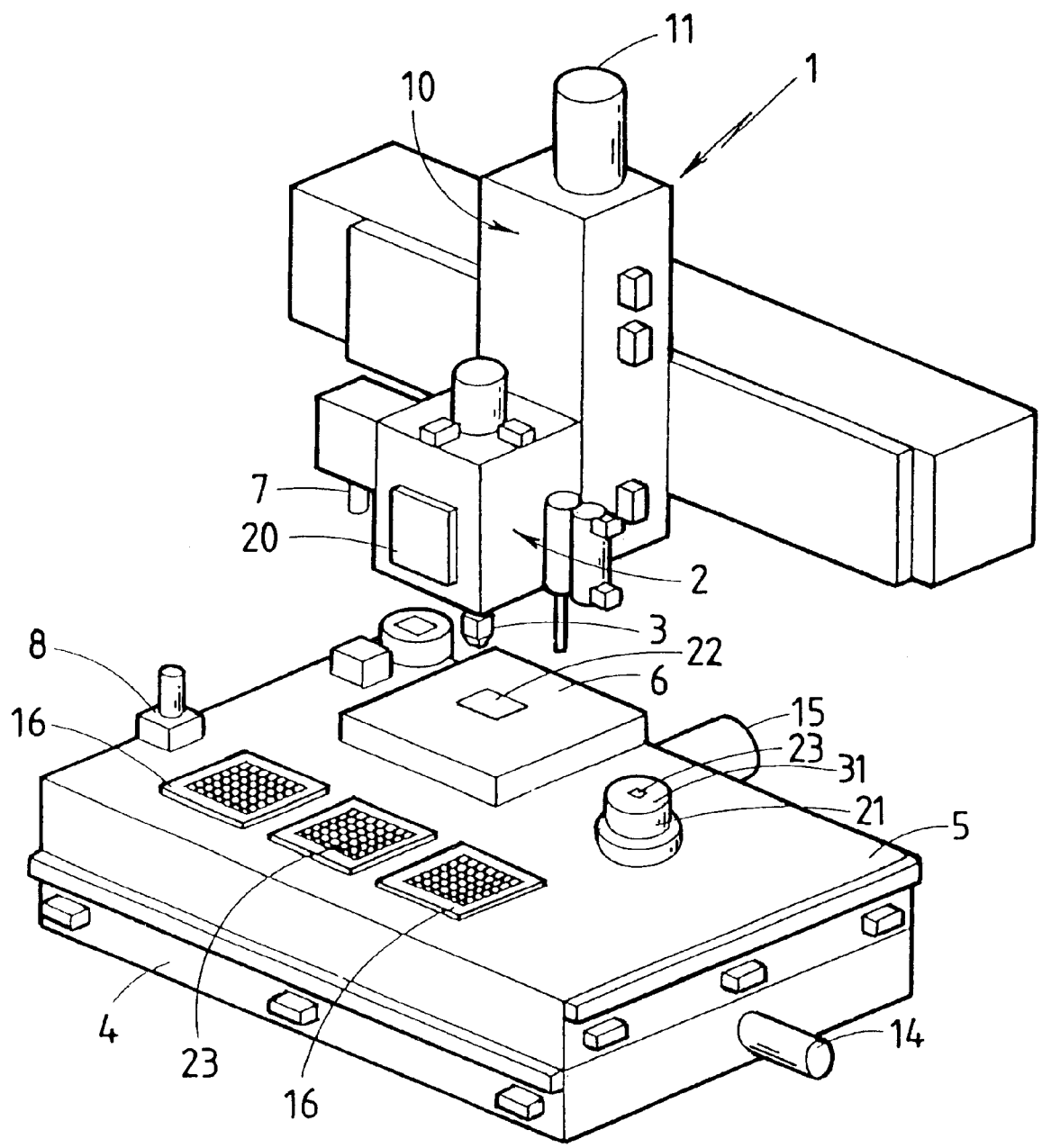
FIG. 1 is a schematic view of a bonding apparatus to which the present invention is applied.

Description will be described below about an embodiment of the present invention with reference to the drawings. FIG. 1 is a schematic view of a bonding apparatus in which present invention is used. The bonding apparatus shown in FIG. 1 is a flip-chip bonding apparatus.

The flip chip bonding apparatus has a bonding tool 3, and X-axis stage 4 and a Y-axis stage 5. The bonding tool 3 absorbs and holds a chip 23. The bonding tool 3 further moves vertically in accordance with a Z-axis drive unit 1 and rotates in accordance with θ-axis drive unit 2. The X-axis stage 4 is allowed to move in the X-axis direction by an X-axis drive motor 14. The Y-axis stage 5 is allowed to move in the Y-axis direction by a Y-axis drive motor 15.

On the Y-axis stage 5, there are disposed a substrate stage 6, chip trays 16, a chip relay stage 21 with a horizontal chip mount surface 31 formed thereon, and a chip recognition camera 8 for taking a picture of the chip 23 absorbed and held by the bonding tool 3 from the lower side of the chip 23. The chip recognition camera 8 is used such a type that its focal position is fixed. On the other hand, a substrate recognition camera 7 and a laser displacement meter 20 for the substrate recognition camera are moved vertically by the Z-axis drive unit 1 together with the bonding tool 3.

Thus, the bonding tool 3 is moved up and down by the Z-axis drive unit 1. A servo motor is used as a Z-axis drive motor 11 of the Z-axis drive unit 1, and the Z-axis drive motor 11 is connected to a motor controller 19.

Thickness data of a reference substrate and thickness data of a reference chip are put into the motor controller 19 in advance. The operation of the Z-axis drive unit 1 in a chip delivery step is established such that the bonding tool 3 moves down and once stops just in front of the chip 23 in accordance with a set value determined in accordance with the thickness of the reference chip, and the bonding tool 3 thereafter moves down gradually.

Figure 2:
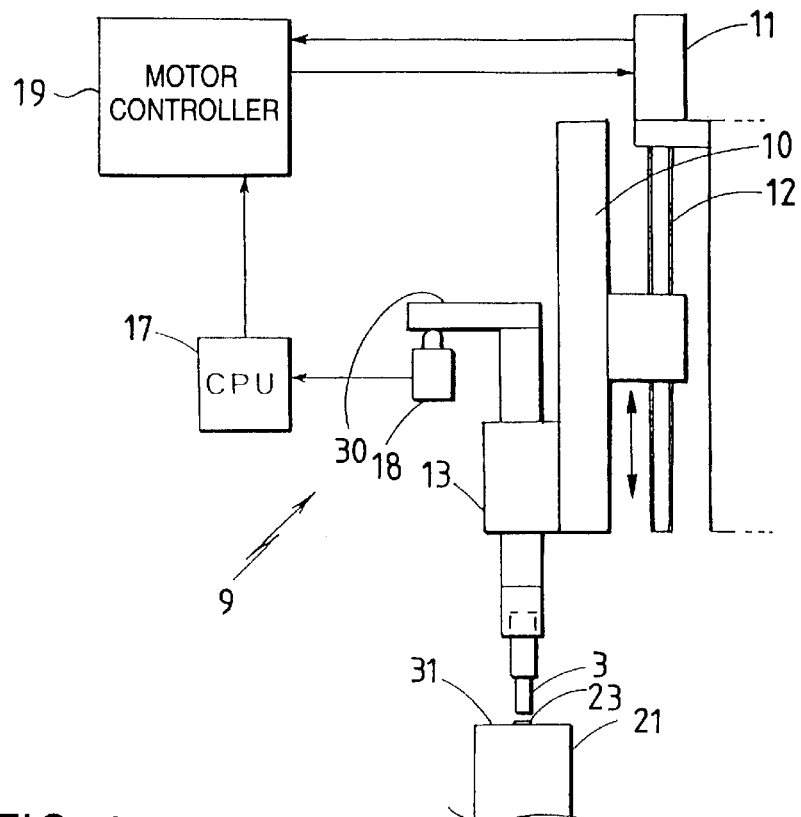
FIG. 2 is an explanatory diagram showing a load control mechanism for position detection.

The Z-axis drive unit 1 is provided with a position detecting load control mechanism 9. FIG. 2 is an explanatory diagram showing the position detecting load control mechanism 9.

The position detecting load control mechanism 9 is constituted by the Z-axis drive motor 11; a Z-axis ball screw 12 rotated by the Z-axis drive motor 11; a tool Z-axis shaft 10 attached to the Z-axis ball screw 12 so as to move vertically in accordance with the rotation of the Z-axis ball screw 12; an air slider 13 and a load measuring load cell 18 which are fixed to the tool Z-axis shaft 10; the bonding tool 3 slidably attached to the air slider 13 and suspended so as to be mounted on the load cell 18 through an contact plate 30; a CPU 17 to which load information is fed back from the load cell 18; and the motor controller 19 for performing torque control of the Z-axis ball screw 12, speed control of the bonding tool 3, etc. The motor controller 19 recognizes the position of contact between the bonding tool 3 and the chip 23 based on load information from the CPU 17 and rotary encoder feedback from the Z-axis drive motor 11.

The contact between the bonding tool 3 and the chip 23 is detected by the position detecting load control mechanism 9 as follows. As shown in FIG. 2, the Z-axis drive motor 11 operates so that the Z-axis ball screw 12 attached to the Z-axis drive motor 11 is rotated. The tool Z-axis shaft 10 moves down in accordance with the rotation of the Z-axis ball screw 12, and the bonding tool 3 also moves down accordingly. The bonding tool 3 once stops moving down to an extent that the bonding tool 3 is not in contact with the chip 23 on the chip mount surface 31 of the chip relay stage 21.

After the temporary stopping, the bonding tool 3 makes a soft landing on the chip 23 and with a set width in a range of from 100 microns to 200 microns. Thus, the bonding tool 3 is controlled based on the height thereof at the first stage, thereafter the descent speed of the bonding tool 3 is lowered, and the bonding tool 3 is controlled based on the load onto the load cell 18. The contact pressure on the chip 23 at that time is detected by the load cell 18. In this embodiment, the load cell 18 is arranged so that the load cell 18 shows a set value of 5 grams when the contact pressure on the chip 23 takes a set value of 5 grams. The descent of the bonding tool 3 is stopped slightly before contacting with the chip 23. The bonding tool 3 further moves down during the range of from 100 microns to 200 microns, and the height of the bonding tool 3 is detected when the load cell 18 shows the value of 5 grams.

In detail, the contact plate 30 for contacting with the load cell 18 is provided on an upper portion of the bonding tool 3, so that the whole weight of the bonding tool 3 is loaded onto the load cell 18 through the contact plate 30 during the moving down of the bonding tool 3. When the bonding tool 3 contacts with the chip 23, the chip 23 begins to receive the weight of the bonding tool 3 and the load onto the load cell 18 is reduced.

The bonding tool 3 contacts with the chip 23 at the moment just when the load detected by the load cell 18 indicates the set value (load of 5 grams). Position information at that time is obtained from a value of the encoder of the Z-axis drive motor 11. This position varies in accordance with a change of the length of the bonding tool or a variation of the thickness of the chip due to thermal expansion or friction. This positional variation will be explained with reference to the explanatory diagram of FIG. 3 showing the state where a chip 23, 24 or 25 is in contact with a bonding tool 3 or 33.

Figure 3:
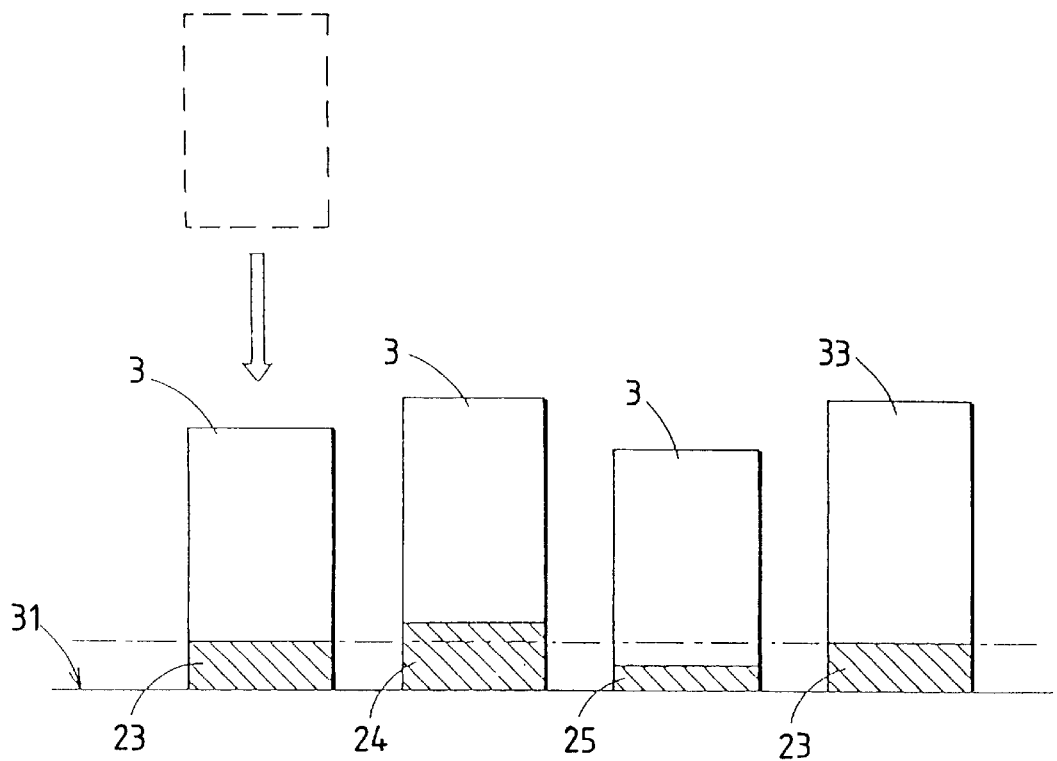
FIG. 3 is an explanatory diagram when a bonding tool is contacted with a chip.

The rectangle on the leftmost side in FIG. 3 shows the state where the reference bonding tool 3 is in contact with the reference chip 23 put on the chip mount surface 31. The second rectangle from the left in FIG. 3 shows the case where the bonding tool 3 has no error from its reference while the chip 24 is thicker than its reference because of an error in manufacturing. Position information in this state where the bonding tool 3 and the chip 24 are in contact shows a higher position than the reference position.

The third rectangle from the left in FIG. 3 shows the case where the bonding tool 3 has no error from its reference while the chip 25 is thinner than its reference because of an error in manufacturing. Position information in this state where the bonding tool 3 and the chip 25 are in contact shows a lower position than the reference position.

The rectangle on the rightmost side in FIG. 3 shows the case where the chip 23 has no error from its reference while the bonding tool 33 itself has got longer. Position information in this state where the bonding tool 33 and the chip 23 are in contact shows a higher position than the reference position.

The contact between the chip 23 and the bonding tool 3 is detected on the chip mount surface 31 of the chip relay stage 21 in this embodiment. In the case where the chip 23 is supplied by face-up, it is also possible to perform the detection by using a chip reversing head as the chip mount surface 31. It is also possible to detect the contact between the chip 23 and the bonding tool 3 by using the Y-axis stage 5 or the chip tray 16 as the chip mount surface 31 if high horizontality can be obtained.

Next, the procedure of image processing as a whole will be described. First, as for the substrate 22, the substrate 22 in a desired position of a not-shown loader portion is picked up, and moved onto the substrate stage 6. This state is shown as the substrate 22 in FIG. 1. After that, the X-axis stage 4 and the Y-axis stage 5 are moved so that the substrate recognition camera 7 is located just above the substrate 22. The distance to the substrate 22 is measured by using the laser displacement meter 20 for the substrate recognition camera so as to judge the thickness of the substrate. Then, a difference between the reference thickness of the substrate 22 which is set in advance and the thickness of the substrate 22 which is a target for bonding is calculated. At that time, the above-mentioned difference in thickness is fed back to the amount of Z-axis movement of the substrate recognition camera 7, so that image processing is performed without fuzziness.

Next, as for the chip 23, a chip in a desired position in the chip tray 16 is picked up by a not-shown pick and place mechanism, and moved onto the chip mount surface 31 of the chip relay stage 21. This state is shown as the chip 23 in FIG. 1. After that, the X-axis stage 4 and the Y-axis stage 5 are moved so that the chip 23 on the chip relay stage 21 is located just below the bonding tool 3. In such a condition, the bonding tool 3 moves down and contacts with the chip 23. When the load cell 18 detects predetermined contact pressure, the bonding tool 3 is stopped moving down, and position information of the Z-axis drive motor 11 at this time is obtained. The bonding tool 3 absorbs the chip 23.

Succeedingly, the bonding tool 3 is moved up to a higher position than a focal position 41 of the chip recognition camera 8. After that, the X-axis stage 4 and the Y-axis stage 5 are moved so that the chip 23 absorbed onto the bonding tool 3 is located just above the chip recognition camera 8.

After that, the bonding tool 3 is moved down so that the lower surface of the chip 23 absorbed thereon is located in the same height as the focal position 41. That is, with reference to the position where the contact between the bonding tool 3 and the upper surface of the chip 23 has been detected, the bonding tool 3 is displaced in the height direction by an amount equal to the difference in the height direction between the chip mount surface 31 and the focal position 41 of the chip recognition camera 8.

Thus, in order to match the chip mount surface 31 with the focal position 41, the height of the bonding tool 3 at the time of contacting with the chip 23 is detected and memorized. And the difference in the height direction between the height at the time of contacting with the chip 23 and the standard height memorized in advance is calculated. When the bonding tool 3 moves to the focal position 41, this difference in the height direction is taken into consideration to match the chip mount surface 31 with the focal position 41.

Figure 4:
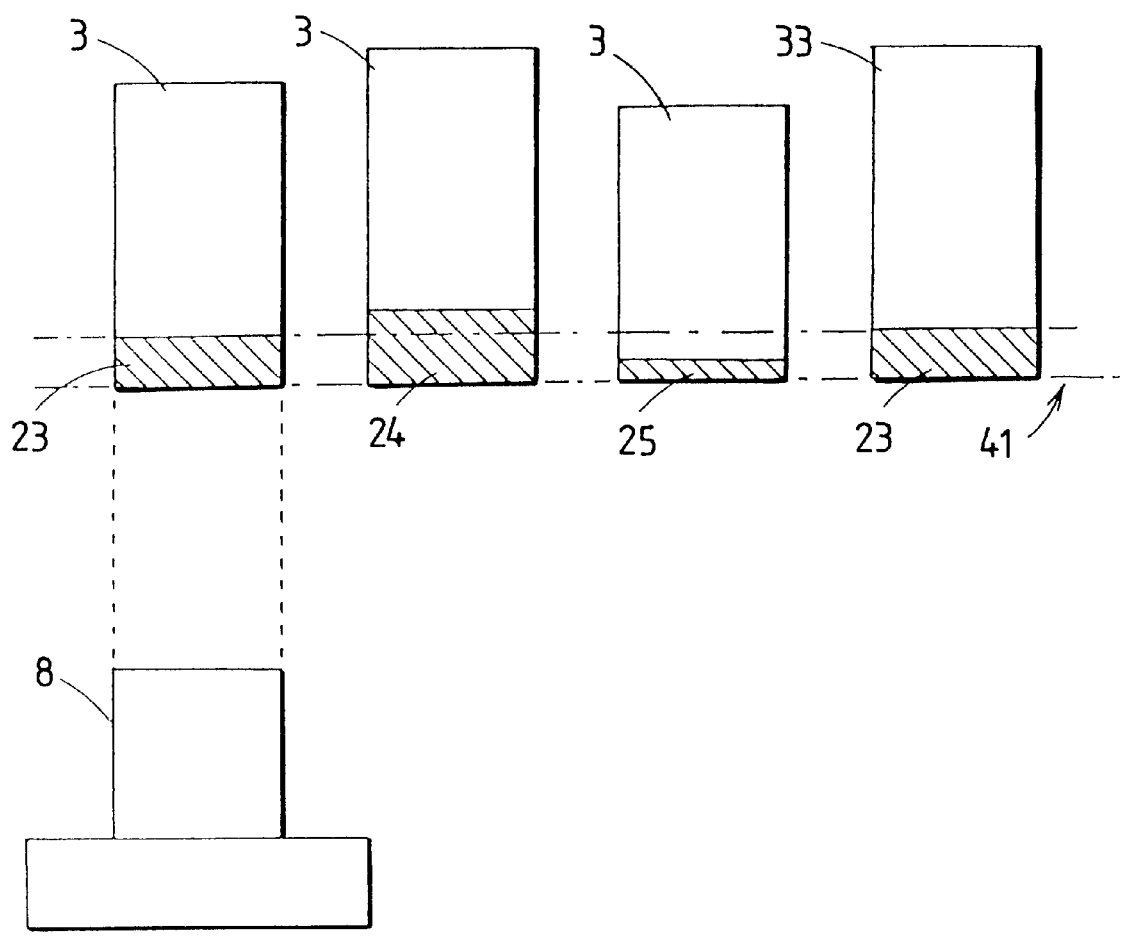
FIG. 4 is an explanatory diagram when the chip is recognized.

Since the chip mount surface 31 is in the same level as the lower surface of the chip 23, 24 or 25 which will be an observed surface, the lower surface of the chip 23, 24 or 25 is always located in the focal position 41 of the chip recognition camera 8, as shown in FIG. 4, if the bonding tool 3 is positioned in the above-mentioned displacement position. As a result, image processing can be performed upon the chip 23, 24 or 25 absorbed on the front end of the bonding tool 3 without fuzziness.

In the above-mentioned configuration, the present invention has effects as follows. First, from a position where a detection means has detected the contact between a chip and a bonding tool, the bonding tool is displaced in the height direction by an amount equal to a difference in the height direction between a chip mount surface and a focal position of a chip recognition camera so that the bonding tool is located above the chip recognition camera. Accordingly, the lower surface of the chip is always located in the focal position. It is therefore possible to perform image processing on the basis of a sharp image without fuzziness, so that it is possible to perform positioning with high precision.

Second, not a laser displacement meter but means for detecting contact between the chip and the bonding tool is used for measuring a deviation of the thickness of the chip or the length of the bonding tool. It is therefore possible to attain an automatically focusing function at a comparatively low cost.

A load cell is used as the detection means and predetermined contact pressure is detected by using the load cell, so that the contact between the chip and the bonding tool is detected and the height as reference for movement is defined. Accordingly, there is no scattering in the detection conditions, so that, as an effect in the embodiment, it is possible to define a position under fixed conditions even if there is a change in the length of the bonding tool or there is a variation in the thickness of the chip.

Although the invention has been described in its preferred formed with a certain degree of particularity, it is understood that the present disclosure of the preferred form can be changed in the details of construction and in the combination and arrangement of parts without departing from the spirit and the scope of the invention as hereinafter claimed.

What is claimed is:

1. A bonding apparatus comprising:

a bonding tool for holding a chip mounted on a mount surface;

an elevating mechanism for elevating said bonding tool;

a chip recognition camera for taking a picture of said held chip from a lower side of said chip;

a detecting device for detecting a contact between said chip on said mount surface and said bonding tool; and a controlling device for displacing said bonding tool in a direction of height from a position where said detecting device has detected the contact between said chip and said bonding tool by a quantity equal to a difference in the height direction between said mount surface and a focal position of said chip recognition camera to thereby place said bonding tool above said chip recognition camera.

\* \* \* \* \*